United States Patent [19]

Yoshida et al.

[11] Patent Number: 4,730,329
[45] Date of Patent: Mar. 8, 1988

[54] SEMICONDUCTOR LASER DEVICE

[75] Inventors: Toshihiko Yoshida, Tenri; Haruhisa Takiguchi; Shinji Kaneiwa, both of Nara; Sadayoshi Matsui, Tenri, all of Japan

[73] Assignee: Sharp Kabushiki Kaisha, Osaka, Japan

[21] Appl. No.: 869,596

[22] Filed: Jun. 2, 1986

[30] Foreign Application Priority Data

Jun. 10, 1985 [JP] Japan .................................. 60-126954

[51] Int. Cl.$^4$ ............................................... H01S 3/18
[52] U.S. Cl. ......................................... 372/46; 372/44; 372/45
[58] Field of Search ............................. 372/44, 45, 46

[56] References Cited

U.S. PATENT DOCUMENTS 4,048,627  7/1977  Ettenbert et al. ................. 357/17
4,597,085  6/1986  Mito et al. ......................... 372/45

FOREIGN PATENT DOCUMENTS 56-155583  4/1980  Japan .

OTHER PUBLICATIONS

Huguchi et al., *Laser Kenkyu*, vol. 13, p. 156, 1985, partial translation.
Mito et al., *Denshi Tsushin Gakkai Technical Report* OQE 80-116, partial translation.
Haruo Nagai et al., "InP/GaInAsP Buried Heterostructure Lasers of 1.5 um Region", Musashino-Shi, Tokyo 180, Received Mar. 8, 1980.
*Japanese Journal of Applied Physics*, vol. 19, No. 4 (Apr., 1980) pp. L218–L220.

*Primary Examiner*—James W. Davie
*Assistant Examiner*—Xuan Vo
*Attorney, Agent, or Firm*—Ciotti, Murashige, Irell & Manella

[57] ABSTRACT

A semiconductor laser includes a mesa-striped laser structure. A substrate has layered on it an active layer with a refractive index higher than that of, and with an energy gap smaller than that of the substrate. A first electrode is formed under the substrate. A cladding layer of a conductivity type different than that of the substrate overlays the active layer. A multilayered burying crystal includes, at the sides of the mesa-striped laser structure, successively first, second and third burying layers. The first and third burying layers are of the same conductivity type as the substrate. The second burying layer is of a conductivity type different from that of the substrate. A cap layer of a conductivity type different than the substrate covers the upper face of the mesa-striped structure and an upper face of the third burying layer. A second electrode is formed on the cap layer. Injected current flowing into a thyristor composed of the cap layer and the three burying layers can be suppressed.

2 Claims, 5 Drawing Figures

SEMICONDUCTOR LASER DEVICE

BACKGROUND OF THE INVENTION

1. Field of the Invention

This invention relates to a semiconductor laser device having a buried heterostructure.

2. Description of the Prior Art

Buried type semiconductor laser devices, in which an active layer for laser oscillation is surrounded by semiconductor layers having a refractive index smaller than that of the active layer and an energy gap larger than that of the active layer, are advantageous in that laser oscillation can be attained in a stable transverse mode at a low threshold current level, and accordingly they have been used as light source for optical communication systems and/or optical measuring systems. For these reasons, they are industrially important devices. However, with such buried type semiconductor laser devices, ineffective current not passing through the active layer greatly increases with an increase in current injected into the devices, which causes limitations to the maximum value of the output power of the devices. Moreover, the ineffective current increases with a rise in temperature, which causes difficulties in practical application of these buried type semiconductor laser devices, especially InGaAsP/InP semiconductor laser devices.

The reasons why the above-mentioned ineffective current arises seem to be as follows: Buried type semiconductor laser devices are, for example, produced in such a manner as shown in FIGS. 2 and 3. The laser device shown in FIG. 2, is produced as follows: On an n-InP substrate 1, an n-InP buffer layer 2, a non-doped InGaAsP active layer 3, and a p-InP cladding layer 4 are successively grown by an epitaxial growth technique. The resulting multi-layered epitaxial growth crystal is subjected to a chemical etching treatment to form a mesa. Then, on both sides of the mesa, a p-InP burying layer 5 and an n-InP burying layer 6 are grown. The laser device shown in FIG. 3 is produced as follows: On an n-InP substrate 1, a p-InP burying layer 5 and an n-InP burying layer 6 are successively grown by an epitaxial growth technique. The resulting epitaxial growth crystal is subjected to a chemical etching treatment to form a groove. Then, an n-InP buffer layer 2, an InGaAsP active layer 3, and a p-InP cladding layer 4 are successively grown in the groove.

The device produced according to the production mode shown in each of FIGS. 2 and 3 attains laser oscillation depending upon the injected current 7 passing through the active layer 3. Since the p-n junction at the interface between the burying layers 5 and 6 positioned at the sides of the active layer 3 is reversely biased, little current passes through the burying layers 5 and 6 when the injected current 7 is small. However, a considerable amount of current passes through the burying layers 5 and 6 positioned at the sides of the active layer 3 as the injected current 7 increases. This is because a thyristor composed of the cladding layer 4, the burying layer 5 and the buffer layer 2 (or the substrate 1) is made conductive by a gate current $7b$ which flows from the cladding layer 4 to the burying layer 5 (Higuchi et al: Laser Kenkyu Vol. 13, p. 156, 1985). If the active layer 3 is formed at the interface between the lower burying layer 5 and the upper burying layer 6, the injected current (i.e., the gate current) $7b$ will be reduced. However, such a precise control of the thickness of layers cannot be made using liquid phase epitaxy and chemical etching techniques at the present. Thus, the ineffective current mentioned above cannot be prevented.

SUMMARY OF THE INVENTION

The semiconductor laser device of this invention, which overcomes the above-discussed and numerous other disadvantages and deficiencies of the prior art, comprises a mesa-striped laser oscillation operation area successively having an semiconductor substrate, an active layer with a refractive index higher than that of said semiconductor substrate and with an energy gap smaller than that of said semiconductor substrate, and a cladding layer with a polarity different from that of said semiconductor substrate, and a multi-layered burying crystal successively having, at the sides of said mesa-striped laser oscillation operation area, a first burying layer with the same polarity as said semiconductor substrate, a second burying layer with a different polarity from said semiconductor substrate, and a third burying layer with the same polarity as said semiconductor substrate, whereby injected current flowing into a thyristor composed of said cladding layer, said first burying layer and said semiconductor substrate can be suppressed.

In a preferred embodiment, the semiconductor laser device further comprises a buffer layer with the same polarity as said semiconductor substrate between said semiconductor substrate and said active layer.

In a preferred embodiment, the semiconductor laser device further comprises a second cladding layer on both said mesa-portion and said third burying layer.

Thus, the invention described herein makes possible the objects of (1) providing a semiconductor laser device in which the flow of current into burying layers positioned at the sides of an active layer is suppressed so that ineffective current is minimal even though current injected into the device is increased; (2) providing a semiconductor laser device in which high output power operation can be achieved without an increase in ineffective current regardless of an increase in current injected into the device, so that the device is suitable for a signal light source; and (3) providing a semiconductor laser device in which, since ineffective current not passing through the active layer is minimal, heat generation of the device due to the ineffective current is prevented and the device operates even at a significantly high temperature.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
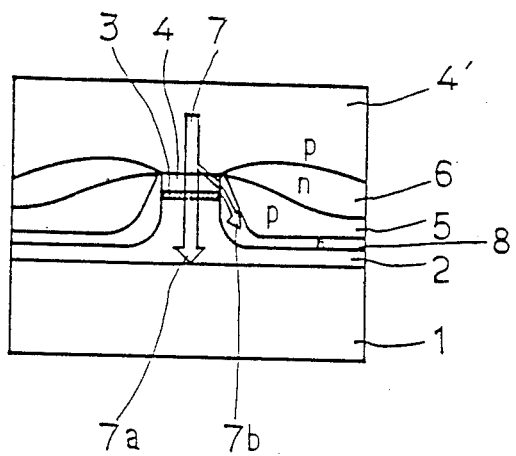
FIG. 1 is a sectional front view showing a semiconductor laser device of this invention.

FIG. 1 shows a semiconductor laser device of this invention, which is produced as follows: On the (100) face of an n-InP substrate 1, an n-InP buffer layer (the thickness thereof being 3 μm) 2, a non-doped InGaAsP active layer (the light emitting wavelength thereof being 1.3 μm and the thickness thereof being 0.2 μm) 3, and a p-InP cladding layer (the thickness thereof being 0.5 μm) 4 are successively grown by liquid phase epitaxy. On the resulting multi-layered growth crystal, a photoresist is formed into a striped pattern (not shown) having a width of 2 μm in the (011) direction by photolithography. Then, the multi-layered growth crystal is etchec by a Br-methanol solution to remove the area around the striped photoresist from the top of the cladding layer 4 to the inside of the buffer layer 2, resulting in a mesa-stripe underneath the striped photoresist. The width of the mesa-stripe is as narrow as approximately 2 μm, and if the height of the mesa-stripe is set at approximately 2 μm, crystal growth on the mesa-stripe in the succeeding process in which burying layers are grown will be able to be suppressed (Mito et al: Denshi Tsushin Gakkai Technical Report OQE 80-116). Although the buffer layer 2 is not necessarily required, it functions to prevent the effect of lattice distortion, etc., in the InP substrate 1.

Then, on the n-InP buffer layer 2, an n-InP first burying layer (the thickness thereof in the flat portion being 0.5 μm) 8 having the same polarity as the buffer layer 2 (or the substrate 1), a p-InP second burying layer (the thickness thereof in the flat portion being 0.8 μm) 5 having a different polarity from the polarity of the buffer layer 2 (or the substrate 1), an n-InP third burying layer (the thickness thereof in the flat portion being 0.8 μm) 6 having the same polarity as the buffer layer 2 (or the substrate 1), and a p-InP cladding-type cap layer (the thickness thereof being 3 μm) 4' are successively grown by liquid phase epitaxy. The cap layer 4' is thick enough to cover the mesa-portion. Then, an n-sided electrode (not shown) and a p-sided electrode (not shown) are formed on the back face of the substrate 1 and the upper face of the cap layer 4', respectively, followed by cleaving at the (110) face, resulting in a resonator for laser oscillation.

It is most important that the above-mentioned structure has a first burying layer 8 which has the same polarity as the buffer layer 2 (or the substrate 1). Because of the first burying layer 8, the gate current 7b never flows into the second and third burying layers 5 and 6. Ineffective current flows, instead, from the cladding layer 4 into the first burying layer 8 without passing through the active layer 3. This fact can be explained in greater detail by FIG. 4, wherein FIG. 4(a) shows an electrically equivalent circuit of the conventional semiconductor laser devices shown in FIGS. 2 and 3 and FIG. 4(b) shows an electrically equivalent circuit of the semiconductor laser device of this example shown in FIG. 1.

Figure 2:
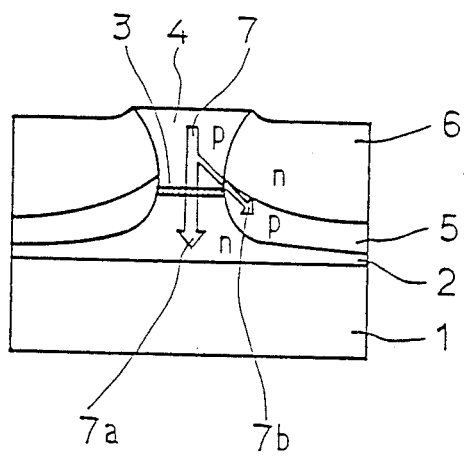
FIG. 2 is a sectional front view showing a conventional buried type semiconductor laser device.
Figure 3:
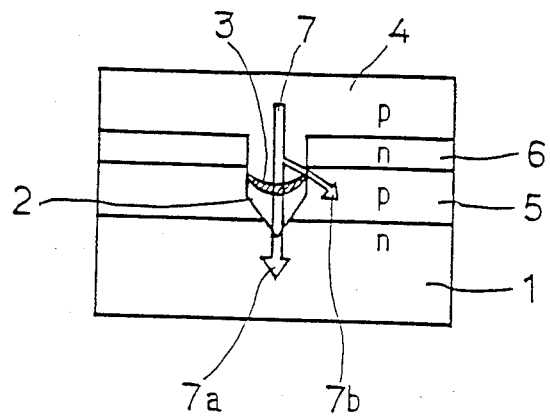
FIG. 3 is a sectional front view showing another conventional buried type semiconductor laser device.
Figure 4:
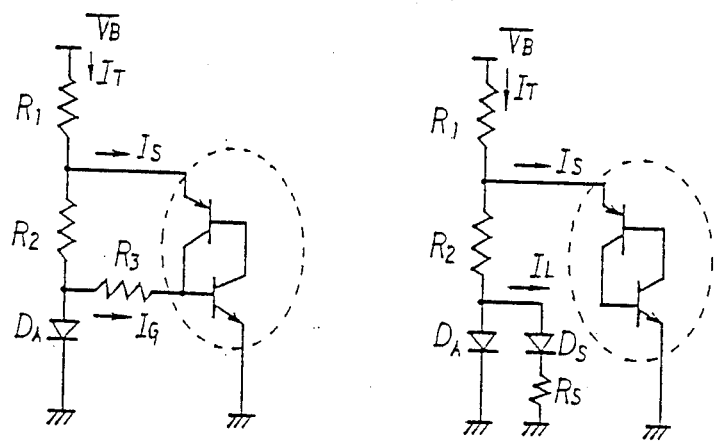
FIG. 4(a) is an electrically equivalent circuit of the semiconductor laser devices shown in FIGS. 2 and 3.
FIG. 4(b) is an electrically equivalent circuit of the semiconductor laser device shown in FIG. 1.

A current-blocking structure can be represented by the equivalent circuit of a thyristor, i.e., the circuit surrounded by the dotted circle, in both the semiconductor laser devices shown in FIG. 1 and FIG. 2 or 3.

With the conventional device structure represented by the equivalent circuit shown in FIG. 4(a), the gate current ($I_G$) 7b increases with an increase in the injected current ($I_T$) 7, and the thyristor is made conductive. Due to the amplification function of the thyristor, a current ($I_S$) which is extremely larger than the gate current ($I_G$) arises. The current ($I_S$) is an ineffective current which does not pass through the active layer 3 represented by a diode $D_A$. Thus, with conventional devices represented by the equivalent circuit shown in FIG. 4(a), the ineffective current steeply increases with an increase in the injected current ($I_T$).

On the other hand, with the device structure of this invention represented by the equivalent circuit shown in FIG. 4(b), ineffective current which passes through a diode $D_S$ (corresponding to the p-n junction formed by the cladding layer 4 and the first burying layer 8) arranged in parallel to a diode $D_A$ (corresponding to the active layer 3) increases with an increase in the injected current ($I_T$). However, the amount of ineffective current is only proportional to the amount of injected current, and the thyristor is maintained to be non-conductive. Thus, the increase in the ineffective current in the device structure of this invention shown in FIG. 4(b) is extremely smaller than that of the effective current in the conventional device structure shown in FIG. 4(a).

As mentioned above, the laser device of this example produces little ineffective current so that oscillating operation at a high output power of 70 mW or more at room temperature can be achieved. Moreover, the effect on heat generation due to such an ineffective current is so small that laser oscillation can be attained even at a temperature as high as 140° C. or more.

Although the above-mentioned example discloses only a device in which an n-substrate is used for the growth substrate, a device using a p-substrate therein as the growth substrate can attain the same effect as mentioned above. An InGaAsP crystal having a light emitting wavelength of 1.3 μm is used for the active layer of the device of this example, but is not limited thereto. InGaAsP crystals having a light emitting wavelength in the range of 1.1 to 1.6 μm can be used for the active layer. An InP crystal is used for the first, second and third burying layers, but is not limited thereto. Other semiconductor materials such as InGaAsP, etc., which have a refractive index smaller than that of the active layer and an energy gap smaller than that of the active layer, can be used for the burying layers. In order for the burying layers to be prevented from growing on the mesa-portion, a $SiO_2$ film or a $Si_3N_4$ film can be formed on the mesa-portion by deposition. The $SiO_2$ film or the $Si_3N_4$ film is, of course, removed before the growth of the cap layer 4'. Moreover, the InGaAsP/InP semiconductor material is used for the epitaxial growth layers, but is not limited thereto. GaAlAs/GaAs semiconductor materials are also applicable to this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:
1. A semiconductor laser device comprising:
a semiconductor substrate of a first conductivity type;
a first electrode formed under said semiconductor substrate;

a mesa-striped structure formed on said semiconductor substrate and successively having an active layer with a refractive index higher than that of said semiconductor substrate and with an energy gap smaller than that of said semiconductor substrate, and a cladding layer of a second conductivity type;

a multi-layered burying crystal successively having, at the sides of said mesa-striped structure, a first burying layer of the first conductivity type, a second burying layer of the second conductivity type, and a third burying layer of the first conductivity type, said second burying layer being thicker than said first burying layer;

a cap layer of the second conductivity type, covering the upper face of said mesa-striped structure and an upper face of said third burying layer; and a second electrode formed on said cap layer, whereby injected current flowing into a thyristor composed of said cap layer, said third burying layer, said second burying layer and said first burying layer can be suppressed.

2. A semiconductor laser device according to claim 1, which further comprises a buffer layer of the first conductivity type between said semiconductor substrate and said active layer.

* * * * *